United States Patent
Sato (10) Patent No.: US 6,501,777 B1
(45) Date of Patent: Dec. 31, 2002

(54) DISTRIBUTED FEEDBACK SEMICONDUCTOR LASER EMITTING DEVICE HAVING ASYMMETRICAL DIFFRACTION GRATINGS

(75) Inventor: Kenji Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/492,612

(22) Filed: Jan. 27, 2000

(30) Foreign Application Priority Data

Jan. 29, 1999 (JP) ............................................. 11-022518

(51) Int. Cl.[7] ................................................ H01S 5/00
(52) U.S. Cl. .............................. 372/45; 372/96; 372/49
(58) Field of Search ........................... 372/44, 45, 46, 372/50, 96, 49

(56) References Cited

U.S. PATENT DOCUMENTS

| | | | | |
|---|---|---|---|---|
| 4,665,528 A | * | 5/1987 | Chinone et al. | 372/96 |
| 4,701,930 A | * | 10/1987 | Akiba et al. | 372/96 |
| 5,012,484 A | * | 4/1991 | Flynn et al. | 372/96 |
| 5,111,475 A | * | 5/1992 | Ackerman et al. | 372/96 |
| 5,271,030 A | * | 12/1993 | Chinen | 372/96 |
| 5,363,399 A | * | 11/1994 | Yagi | 372/96 |
| 5,386,433 A | * | 1/1995 | Ohkura et al. | 372/96 |
| 5,936,994 A | * | 8/1999 | Hong et al. | |

FOREIGN PATENT DOCUMENTS

| | | | |
|---|---|---|---|
| JP | 61-216383 | 9/1986 | ............. H01S/3/18 |
| JP | 4-100287 | 4/1992 | ............. H01S/3/18 |
| JP | 6-66509 | 8/1994 | ............. H01S/3/18 |

OTHER PUBLICATIONS

"Semiconductor Laser", edited by the Society of Applied Physics, published by Ohm Corporation, pp. 259–282, 1994. (no month).

* cited by examiner

Primary Examiner—Quyen Leung
(74) Attorney, Agent, or Firm—Choate, Hall & Stewart (57) ABSTRACT

A phase-shift distributed feedback semiconductor laser emitting device includes a resonator between a diffraction grating and a multiple quantum well layer, and the diffraction grating has a modulated period region different in period from a standard period region so as to make the diffraction grating asymmetrical with respect to a center of the diffraction grating, thereby increasing an optical output power at an output end surface.

23 Claims, 7 Drawing Sheets

DISTRIBUTED FEEDBACK SEMICONDUCTOR LASER EMITTING DEVICE HAVING ASYMMETRICAL DIFFRACTION GRATINGS

FIELD OF THE INVENTION

This invention relates to a semiconductor laser emitting device and, more particularly, to a phase-shift DFB (Distributed Feed-Back) semiconductor laser emitting device appropriate to a digital optical transmission system.

DESCRIPTION OF THE RELATED ART

The semiconductor laser emitting device is an essential component in the conventional digital optical transmission system. A quarter-wavelength phase-shift DFB semiconductor laser emitting device has a multiple-layered semiconductor structure, which has diffraction gratings different in phase from each other by a half period at the central point of the laser oscillator. The quarter-wavelength phase-shift DFB is stable in single oscillation mode, and is appropriate to the digital optical transmission system. The multiple-layered semiconductor structure for the quarter-wavelength phase-shift DFB semiconductor laser emitting device is known to person skilled in the art. A typical example of the multiple-layered semiconductor structure is disclosed in "Semiconductor Laser", edited by the Society of Applied Physics and published by Ohm Corporation, page 272, FIG. 12—12, 1994.

Figure 1:
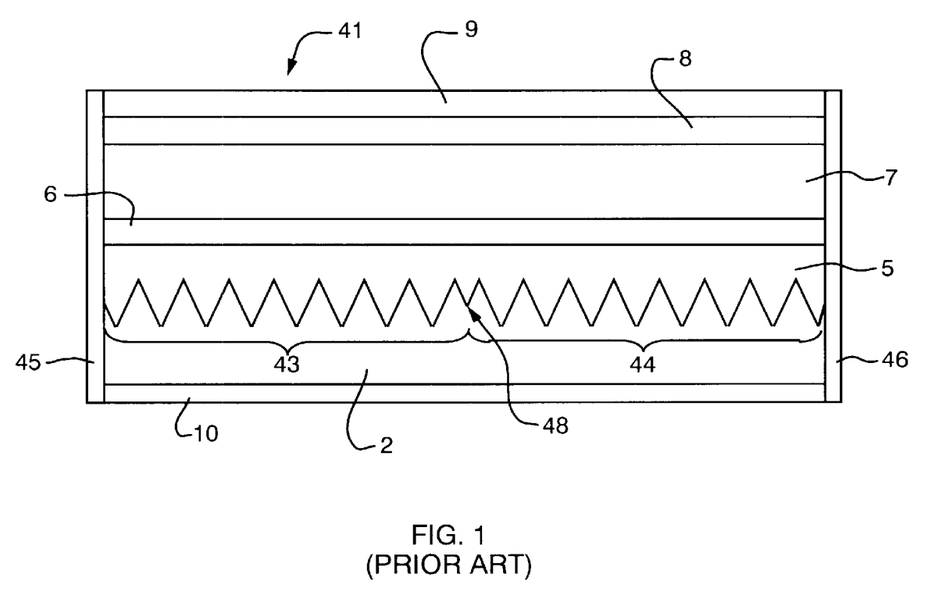
FIG. 1 is a cross sectional view showing the structure of the prior art phase-shift DFB semiconductor laser emitting device.

FIG. 1 shows a typical example of the phase-shift DFB semiconductor laser emitting device. The prior art phase-shift DFB semiconductor laser emitting device 41 has a multiple-layered semiconductor structure, which consists of a semiconductor substrate 2 of n-type InP, an optical guide layer 5 of n-type InGaAs grown on the semiconductor substrate 2, a multiple quantum well layer 6 grown on the optical guide layer 5, a clad layer 7 of p-type InP grown on the multiple quantum well layer 6 and a cap layer 8 of p-type InP grown on the clad layer 7. The cap layer 8 is overlain by a p-type electrode 9, and an n-type electrode 10 is formed on the reverse surface of the semiconductor substrate 2. Low-reflection coating layers 45/46 are formed on end surfaces of the multiple-layered semiconductor structure. The optical guide layer 5 serves as a laser resonator, and diffraction gratings 43/44 are formed at the boundary between the semiconductor substrate 2 and the optical guide layer 5. The diffraction grating 43 is different from the other diffraction grating 44 by a half of the period at a phase shift point 48. The prior art phase-shift DFB semiconductor laser emitting device 41 oscillates at the Bragg wavelength $\lambda_B$, and the Bragg wavelength $\lambda_B$ is expressed as $$\lambda_B = 2\Lambda n_{eff}$$

where $\Lambda$ is the period of the diffraction grating and $n_{eff}$ is the effective refractive index. As a result, the other oscillation mode is effectively restricted.

Although the phase shift point 48 is indispensable for the phase-shift DFB semiconductor laser emitting device, the internal electric field is made extremely strong around the phase shift point 48. When the bias voltage is increased, the lack of uniformity in the internal electric field gets more serious, and the output optical power is decreased. Moreover, the reflectivity of the low-refractive coating layers 45/46 is of the order of 1 percent, and the laser light is radiated in the backward direction as much as the laser light radiated in the forward direction. This means that the prior art phase-shift DFB semiconductor laser emitting device can not achieve a high optical output efficiency in terms of the input current.

Another prior art phase-shift DFB semiconductor laser emitting device is disclosed in Japanese Patent Publication of Unexamined Application No. 4-100287, and aims at a high optical output efficiency. The diffracting gratings are not changed at any phase-shift point in the prior art phase-shift DFB semiconductor laser emitting device disclosed in the Japanese Patent Publication of Unexamined Application. The period of the diffraction grating is gradually modulated in a part of the laser oscillator, and the gradual modulation is designed to be equivalent to the quarter-wavelength phase shift. The concentration of internal electric field is less serious rather than that of the prior art phase-shift DFB semiconductor laser emitting device shown in FIG. 1. This results in improvement of the intensity of the output laser light.

Thus, the prior art phase-shift DFB semiconductor laser emitting device disclosed in the Japanese Patent Publication of Unexamined Application achieves a high optical output. However, the end surfaces are coated with low-refractive coating layers, and the laser light is equally radiated from both end surfaces. This means that the prior art phase-shift DFB semiconductor laser emitting device still does not achieve a high optical output efficiency in terms of the input current.

Yet another prior art phase-shift DFB semiconductor laser emitting device is disclosed in Japanese Patent Publication of Unexamined Application No. 61-216383. A cleavage plane or a high refractive coating layer are used at the backward end surface of the prior art phase-shift DFB semiconductor laser emitting device, and the phase-shift point is closer to the backward end surface. The phase-shift point divides the laser oscillator at 3:7–4:6. The forward end surface is coated with a low-refractive coating layer. When the backward end surface is the cleavage plane, the reflectivity is of the order of 30 percent. However, the high-reflective coating surface achieves the reflectivity more than 90 percent. This results in that the prior art phase-shift DFB semiconductor laser emitting device radiates the laser light in the forward direction much more than the laser light radiated in the backward direction. The Japanese Patent Publication of Unexamined Application insists that the phase-shift point closer to the backward end surface enhances the stability of the single oscillation mode. The prior art phase-shift DFB semiconductor laser emitting device achieves a high optical output efficiency in terms of the input current. However, the period of the diffraction grating is changed at the phase-shift point as similar to the prior art phase-shift DFB semiconductor laser emitting device shown in FIG. 1, and the phase-shift point makes the internal electric field extremely strong thereat. Although the intensity of the output laser light is slightly enhanced by virtue of the phase-shift point farther from the forward end surface than the phase-shift point 48, the intensity of the output laser light does not satisfy the user.

The present inventor calculates the ratio of the forwardly output laser light to the backwardly output laser light on the assumption that the reflectivity at the backward end surface is 95 percent. The ratio is 4:1. When the cleavage plane is used for the backward end surface, the margin is only several microns. If the cleavage plane is deviated by several microns, the optical output is clearly decreased. This results in a serious distribution of the laser output characteristics between the products.

Still another prior art phase-shift DFB semiconductor laser emitting device is disclosed in Japanese Patent Publication of Examined Application No. 6-66509, which is corresponding to Japanese Patent Publication of Unexamined Application No. 60-125882. The prior art phase-shift DFB semiconductor laser emitting device aims at enhancement of the single oscillation mode. However, the prior art phase-shift DFB semiconductor laser emitting device can not increase the optical output efficiency in terms of the input current. The prior art phase-shift DFB semiconductor laser emitting device has two diffraction gratings different in period from one another in the laser oscillator, and the two diffraction gratings are asymmetrical with each other. The periods of the two diffraction gratings are designed in such a manner that the longitudinal mode with the minimum gain in one of the diffraction gratings is overlapped with the longitudinal mode with the minimum gain of the other diffraction grating. Although the two diffraction gratings enhances the single oscillation mode, they can not increase the intensity of the output optical light, and, accordingly, the Japanese Patent Publication of Examined Application is silent to any increase of the output optical light.

SUMMARY OF THE INVENTION

It is therefore an important object of the present invention to provide a DFB semiconductor laser emitting device, which is stable in the single oscillation mode, large in output optical power, high in current-to-laser light converting efficiency and small in dispersion of the device characteristics.

In accordance with one aspect of the present invention, there is provided a distributed feedback semiconductor laser emitting device for radiating a laser light beam comprising a pair of electrodes applied with a potential difference, a multiple-layered semiconductor structure connected to the electrodes of the pair and including a first compound semiconductor layer extending between a first end surface of the multiple-layered semiconductor structure serving as an optical output and a second end surface of the multiple-layered semiconductor structure opposite to the first end surface and a diffraction grating structure held in contact with the first compound semiconductor layer, extending between the first end surface and the second end surface and having a standard period region constant in period and connected at one end thereof to the first end surface and a modulated period region different in period from the standard period region and making the diffraction grating asymmetrical with respect to a center of the diffraction grating, a first reflective coating layer formed on the first end surface and a second reflective coating layer formed on the second end surface and making the first compound semiconductor layer serve as a resonator.

BRIEF DESCRIPTION OF THE DRAWINGS

The features and advantages of the distributed feedback semiconductor laser emitting device will be more clearly understood from the following description taken in conjunction with the accompanying drawings in which.

DESCRIPTION OF THE PREFERRED EMBODIMENTS

First Embodiment

Figure 2:
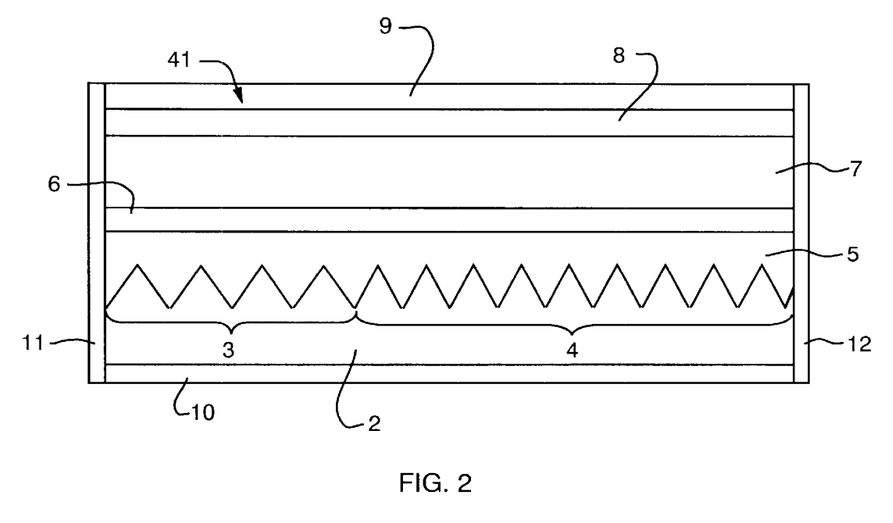
FIG. 2 is a cross sectional view showing the structure of a phase-shift DFB semiconductor laser emitting device according to the present invention.

Referring to FIG. 2 of the drawings, a phase-shift distributed feedback semiconductor laser emitting device 1 embodying the present invention has a multiple layered semiconductor structure, and comprises a semiconductor substrate 2, an optical guide layer 5 formed on the semiconductor substrate 2, a multiple quantum well layer 6 formed on the optical guide layer 5, a clad layer 7 formed on the multiple quantum well layer 6 and a cap layer 8 formed on the clad layer 7. In this instance, the semiconductor substrate, the optical guide layer 5, the clad layer 7 and the cap layer 8 are respectively formed of n-type InP, n-type InGaAs, p-type InP and heavily-doped p-type InP. Diffraction gratings 3 and 4 are formed on the major surface of the semiconductor substrate 2 by using an electron beam lithography and known etching techniques. The multiple quantum well layer 6 is formed of a combination of compound semiconductor materials. The diffraction grating 4 serves as a standard period region, and the other diffraction grating 3 serves as a modulated period region. The diffraction gratings 3/4 are 0.02 micron deep, and the distributed feedback coupling coefficient κ falls within 40–50 cm$^{-1}$.

The optical guide layer 5, the multiple quantum well layer 6, the clad layer 7 and the cap layer 8 are successively grown on the semiconductor substrate 2 through an epitaxial growing technique after forming the diffraction gratings 3/4, and are 0.1 micron thick, 0.2 micron thick, 3 microns thick and 0.2 micron thick, respectively.

The multiple layered semiconductor structure is sandwiched between a p-type electrode 9 and an n-type electrode 10. Namely, the p-type electrode 9 is formed on the upper surface of the cap layer 8, and the n-type electrode is formed on the lower surface of the semiconductor substrate 2. The p-type electrode 9 and the n-type electrode 10 are deposited through known techniques. A high reflective coating layer 11 is formed on an end surface of the multiple layered semiconductor structure, and a low-reflective coating layer 12 is formed on the other end surface of the multiple layered semiconductor structure. The end surface coated with the low-reflective coating layer 12 serves as an optical output. The high reflective coating layer 11 is formed of a material, which has a large reflectance. On the other hand, the low reflective coating layer 12 is formed of a material, which has a small reflectance. The diffraction grating 3 is closer to the high reflective coating layer 11 than the low reflective coating layer 12, and, accordingly, the diffraction grating 4 is closer to the low reflective coating layer 12 than the high reflective coating layer 11. The optical guide layer 5 serves as a resonator. When a potential difference is applied between the p-type electrode 9 and the n-type electrode 10, an electric field is created in the optical guide layer 5 or the resonator, and a laser beam is radiated from the forward end surface.

Figure 3:
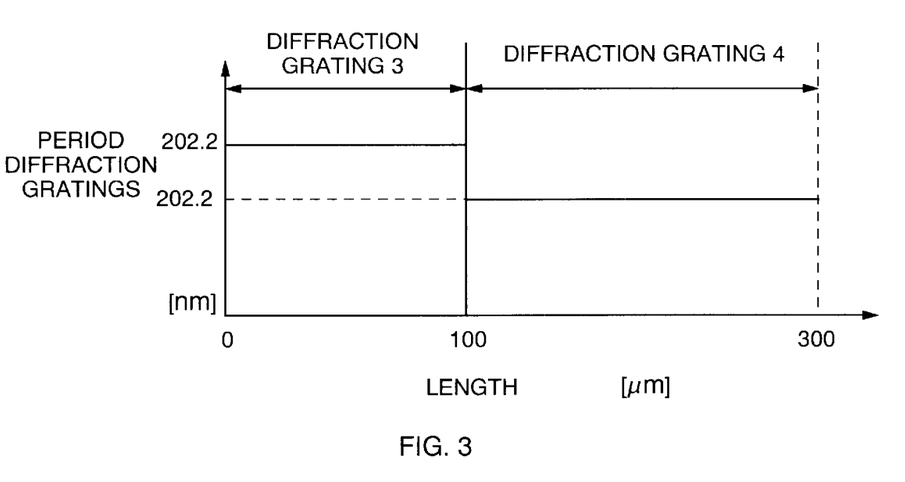
FIG. 3 is a graph showing a distribution of period in diffraction gratings formed in the phase-shift DFB semiconductor laser emitting device.

There is a distribution of period in the diffraction gratings 3 and 4 as shown in FIG. 3. The diffraction grating 3 has a period of 202.2 nanometers, and the length of the diffraction grating 3 is 100 microns. On the other hand, the period of the diffraction grating 4 is 202.0 nanometers, and the length is 200 nanometers. However, the phase is continued between the diffraction grating 3 and the diffraction grating 4. Thus, the diffraction gratings 3/4 are asymmetrical with respect to the center of the resonator, i.e., at 150 microns from the backward end surface.

The modulation of period and the reflection on the high-reflective coating layer 11 achieve a phase shift equivalent to a quarter wavelength, and the phase shift equivalent to the quarter wavelength enhances the stability of the single oscillation mode. The asymmetrical diffraction gratings 3/4 make the amount of distributed feedback asymmetry, and the strength of internal electric field is asymmetrically distributed with respect to the center of the resonator. This results in an optical output at the forward end surface larger than the prior arts. Moreover, the high-reflective coating layer 11 increases the optical output at the forward end surface.

The modulated period region enhances the production yield. The phase of a diffraction grating is not constant at the backward end surface, and the distribution of the phase results in irregularity of the device characteristics. The phase-shift DFB semiconductor laser emitting device implementing the first embodiment has the modulated period region between the standard period region and the high-reflective coating layer 11, and the modulated period region makes the difference in phase at the backward end surface less influential.

The standard period region is not less than a half of the total length of the diffraction gratings 3/4. In this instance, the standard period region is single. However, the standard period region may be divided into plural sub-regions. Nevertheless, it is necessary that at least one of the plural sub-regions is contiguous to the forward end surface serving as an optical output. When the standard period region is single as the phase-shift DFB semiconductor laser emitting device implementing the first embodiment, the single standard period region extends from the forward end surface over the center of the total length. On the other hand, if the standard period region is divided into plural subregions, at least a half of the standard period region, i. e., the total of the sub-regions is located between the center and the forward end surface. This feature makes the diffraction gratings 3/4 asymmetrical, and enhances the stability of the single oscillation mode.

The modulated period region has a period of the diffraction grating 3 different from the period of the standard period region. The modulated period region is either single or divided into plural sub-regions. Nevertheless, the single modulated period region is desirable from the view point of the stability in single oscillation mode. The modulated period region contiguous to the backward end surface is most preferable. Although the period of the modulated period region of the first embodiment is constant, the period may be varied in so far as it is different from the period of the standard period region. The varied period makes the influence of the difference in phase at the backward end surface smaller, and is conducive to a high production yield. In this instance, the period of the modulated period region is longer than the period of the standard period region. Another phase-shift DFB semiconductor laser emitting device according to the present invention may have a modulated period region shorter in period than an associated standard period region. In case where the period is varied in the modulated period region, it is preferable to linearly vary the period. Especially, it is most preferable that the difference from the period in the standard period region is gradually increased toward the backward end surface.

In this instance, the diffraction grating 3 is continued to the diffraction grating 4. Another phase-shift DFB semiconductor laser emitting device may have a diffraction grating serving as the standard period region discontinuous to an associated diffraction grating serving as the modulated period region.

Figure 4:
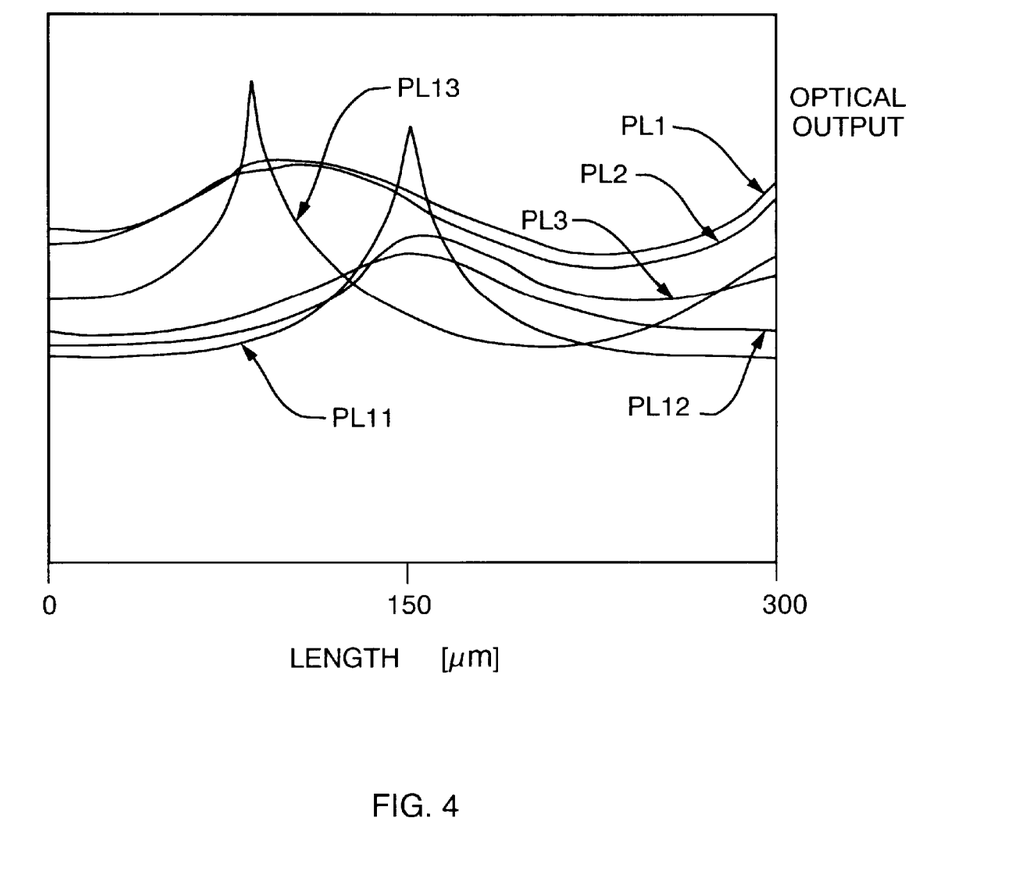
FIG. 4 is a graph showing distributions of a relative strength of internal electric field created in an optical guide layer formed in phase-shift DFB semiconductor laser emitting devices.

The present inventor evaluated the phase-shift DFB semiconductor laser emitting device shown in FIG. 2. First, the present inventor determined an internal electric field under the application of potential difference between the p-type electrode 9 and the n-type electrode 10. The relative strength of the internal electric field was distributed due to the asymmetrical diffraction gratings 3/4, and plots PL1 were indicative of the distribution of the relative strength in the resonator 5 (see FIG. 4). The relative strength was larger at the forward end surface coated with the low-reflective coating layer 12 than at the backward end surface coated with the high-reflective coating layer 11. The relative strength was gently waved from the backward end surface coated with the high-reflective coating layer 11 toward the forward end surface coated with the low-reflective coating layer 12, and was never concentrated.

The present inventor measured the output power of laser beams radiated from both end surfaces. The output power of laser beam radiated through the low-reflective coating layer 12 was six times larger than the output power of laser beam radiated through the high-reflective coating layer 11.

The present inventor further investigated the stability of the single oscillation mode. A difference $\Delta \alpha L$ of threshold gain was representative of the stability, and the present inventor calculated the difference $\Delta \alpha L$ of threshold gain. The present inventor confirmed that the difference $\Delta \alpha L$ of threshold gain was 0.6. Thus, the difference $\Delta \alpha L$ of threshold gain was greater than the critical value of 0.5, which was admitted to be acceptable for a practice usage.

The present inventor further investigated the influence of the cleavage plane on the optical output efficiency in terms of the input current. When the cleavage plane was deviated from the target plane, the optical output efficiency was decreased. The decrement was gentle in the phase-shift DFB semiconductor laser emitting device implementing the first embodiment as indicated by plots PL1 in FIG. 5.

The present inventor further evaluated the phase-shift DFB semiconductor laser emitting device in comparison with the prior art devices. In the following description, the prior art phase-shift DFB semiconductor laser emitting device shown in FIG. 1, the prior art phase-shift DFB semiconductor laser emitting device disclosed in Japanese Patent Publication of Unexamined Application No. 4-100287 and the prior art phase-shift DFB semiconductor laser emitting device disclosed in Japanese Patent Publication of Unexamined Application No. 61-216383 are referred to as "the first prior art", "the second prior art" and "the third prior art", respectively.

The present inventor fabricated the first prior art, the second prior art and the third prior art. The first prior art had the phase-shift point 48 at the center of the resonator. The second prior art had a period modulating portion in the resonator, and the period modulating portion gradually shifted the period, the amount of which was equivalent to the quarter wavelength. The third prior art had a high-reflective coating layer at the backward end surface and a low-reflective coating layer at the forward end surface, and the phase-shift structure was formed at the point, which was closer to the backward end surface and divided the resonator at 3:7. The first prior art, the second prior art and the third prior art were equal in dimensions to the first embodiment except the dimensions of the diffraction gratings 3/4.

The present inventor determined a distribution of relative strength of the internal electric field created in each of the first-third prior arts. The present inventor plotted the relative strength of the internal electric field in FIG. 4. Plots PL11, plots PL12 and plots PL13 were indicative of the distribution of relative strength created in the first prior art, the distribution of relative strength created in the second prior art and the distribution of relative strength created in the third prior art, respectively. It was understood from plots PL11 and plots PL13 that the electric fields were seriously concentrated at steep peaks representative of the phase-shift structures. It was further understood from plots PL12 and PL13 that, although the electric fields were gently waved, the strength of electric field at the optical output was relatively small. Comparing plots PL1 with plots PL11/PL12/PL13, the distribution of relative strength created in the first embodiment was gentle and large around the optical end. Thus, the diffraction gratings 3/4 asymmetrical with each other and the high-reflective coating layer 11 improved the device characteristics of the phase-shift DFB semiconductor laser emitting device implementing the first embodiment.

Figure 5:
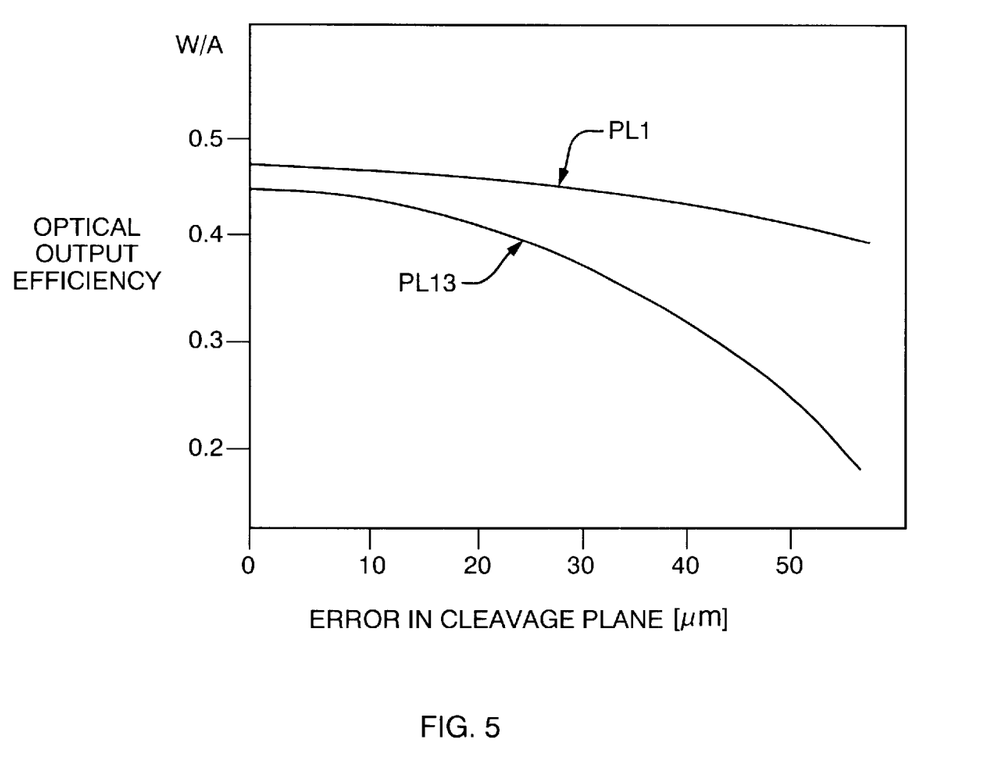
FIG. 5 is a graph showing an optical output efficiency in terms of an input current.

The present inventor measured the optical output efficiency in terms of the input current in the third prior art, and plotted the optical output efficiency in FIG. 5. Plots PL13 were indicative of the optical output efficiency. Comparing plots PL1 with plots PL13, it was understood that the modulated period region was effective against the error in the cleavage plane.

Second Embodiment

Figure 6:
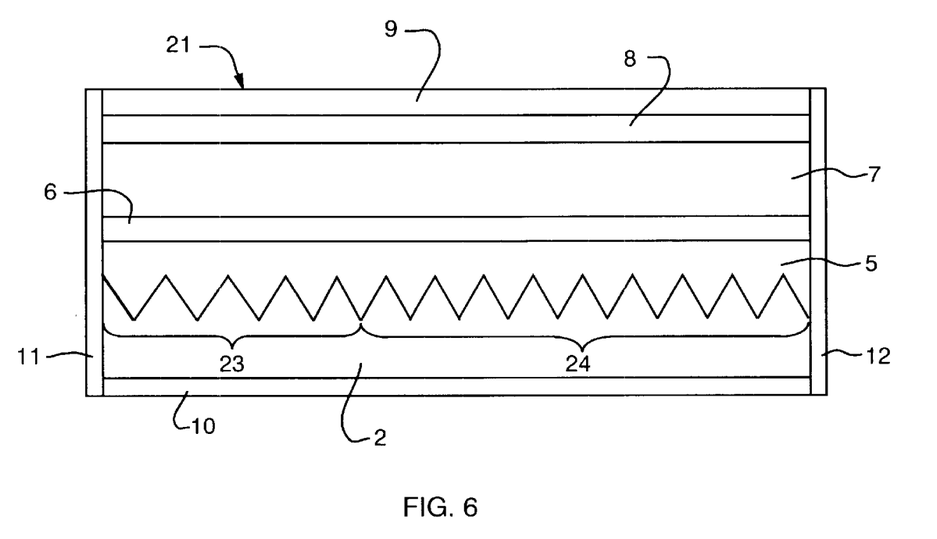
FIG. 6 is a cross sectional view showing the structure of another phase-shift DFB semiconductor laser emitting device according to the present invention.

FIG. 6 shows another phase-shift DFB semiconductor laser emitting device 21 embodying the present invention. The phase-shift DFB semiconductor laser emitting device implementing the second embodiment is similar to the first embodiment except diffraction gratings 23/24. For this reason, layers and electrodes of the phase-shift DFB semiconductor laser emitting device are labeled with the same references designating corresponding layers and electrodes of the first embodiment without detailed description.

Figure 7:
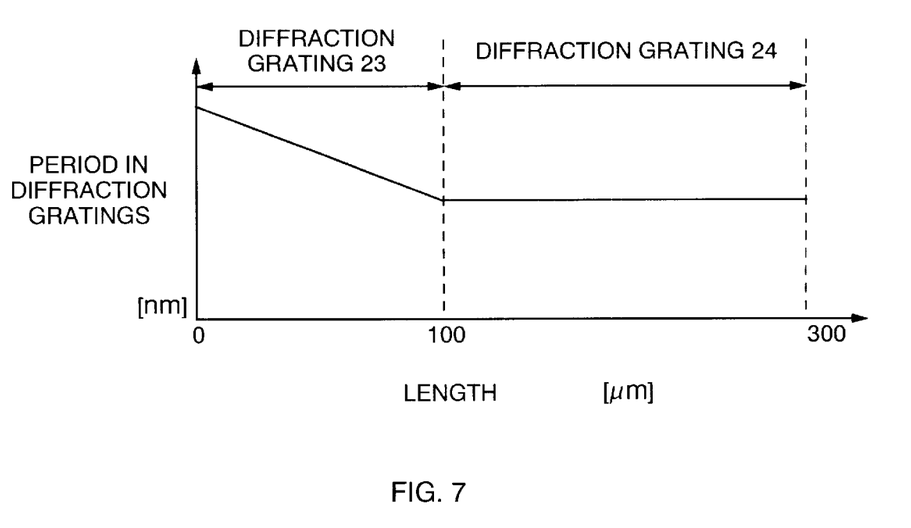
FIG. 7 is a graph showing a distribution of period in diffraction gratings formed in the phase-shift DFB semiconductor laser emitting device.

The diffraction grating 23 and the diffraction grating 24 serve as a modulated period region and a standard period region, respectively. The period is distributed as shown in FIG. 7. The diffraction grating 23 and the high-reflective/low-reflective coating layers 11/12 give the phase shift equivalent to a quarter wavelength to the resonator. The period of the diffraction grating 23 is 202.4 nanometers at the backward end surface, and is gradually decreased to 202.0 nanometers at 100 microns from the backward end surface. In this instance, the period is linearly varied in the modulated period region. However, the period may be non-linearly varied in another phase-shift DFB semiconductor laser emitting device according to the present invention. The period may be constant in a backward end portion. The backward end portion may be of the order of ten microns long. Even if the cleavage plane is deviated from the target plane by several microns, the backward end portion causes the period of the diffraction grating to fall within the design range.

The diffraction grating 24 is constant in period, and the period is 202.0 nanometers. The diffraction grating 24 is 200 microns long, and the total length of the resonator 5 is 300 microns. The phase is continuous between the diffraction gratings 23 and 24.

The present inventor evaluated the phase-shift DFB semiconductor laser emitting device shown in FIG. 6. Plots PL2 was indicative of a distribution of relative strength in the electric field (see FIG. 4). The relative strength at the forward end surface was larger than that at the backward end surface. The relative strength was gently waved, and any steep peak did not take place.

The present inventor measured the optical power radiated from the forward end surface and the backward end surface. The optical power radiated from the forward end surface was five times larger than the optical power radiated from the backward end surface.

The present inventor calculated the difference $\Delta\alpha L$ of threshold gain. The present inventor confirmed that the difference $\Delta\alpha L$ of threshold gain was 0.65. Thus, the difference $\Delta\alpha L$ of threshold gain was greater than the critical value of 0.5, which was admitted to be acceptable for a practice usage.

Third Embodiment

Figure 8:
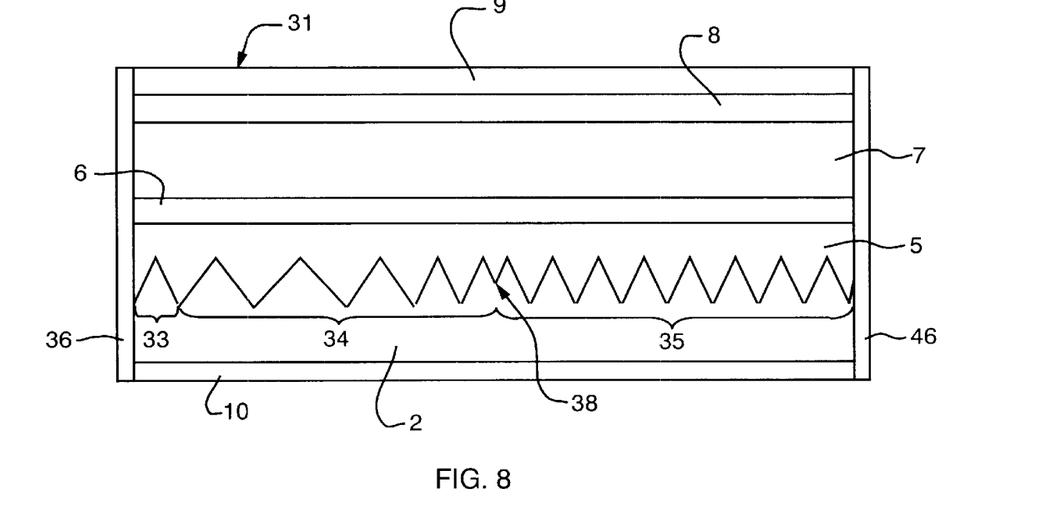
FIG. 8 is a cross sectional view showing the structure of yet another phase-shift DFB semiconductor laser emitting device according to the present invention.

FIG. 8 illustrates yet another phase-shift DFB semiconductor laser emitting device embodying the present invention. The phase-shift DFB semiconductor laser emitting device implementing the third embodiment is similar to the first embodiment except diffraction gratings 33/34/35 and low-reflective coating layers 36/37. For this reason, description is focused on the diffraction gratings 33/34/35 and the low-reflective coating layers 36/37. The other layers and the electrodes of the third embodiment are labeled with the same references designating corresponding layers and electrodes of the first embodiment without detailed description.

The multiple layered semiconductor structure is fabricated as similar to the first embodiment. The low-reflective coating layers 36/37 are formed on the backward end surface and the forward end surface of the multiple layered semiconductor structure.

Figure 9:
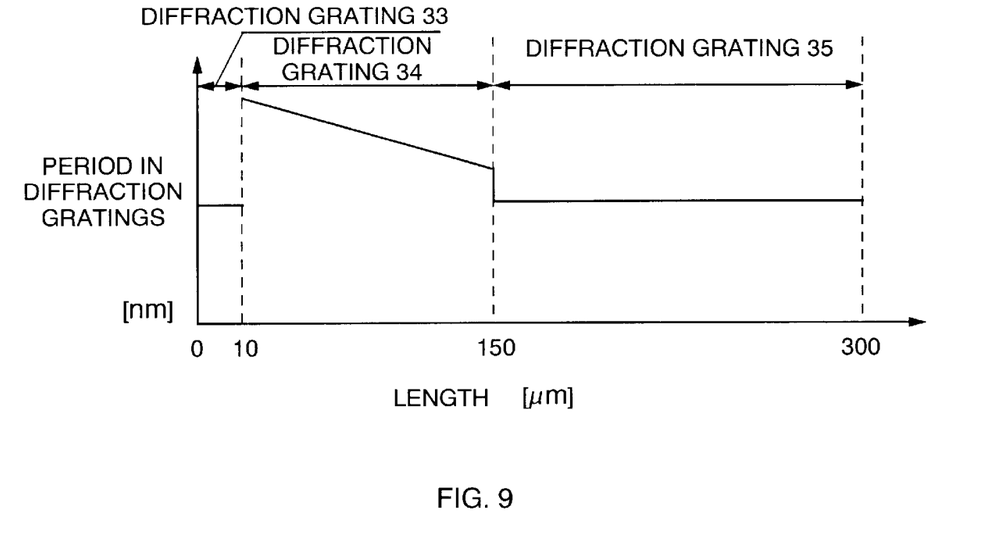
FIG. 9 is a graph showing a distribution of period in diffraction gratings formed in the phase-shift DFB semiconductor laser emitting device.

The diffraction gratings 33 and 35 serve as a standard period region, and the other diffraction grating 34 serves as a modulated period region. The diffraction gratings 33/34/35 are produced through an etching, and the etching depth is 0.03 micron. This results in the distributed feedback coupling coefficient κ is 70 $cm^{-1}$. The period of the diffraction gratings 33/34/35 is distributed as shown in FIG. 9. The diffraction grating 33 is 10 microns long, and the period of the diffraction grating 33 is 202.0 nanometers. The diffraction grating 34 is 140 microns long. The period thereof is 202.2 nanometers at the so boundary to the diffraction grating 33, and is decreased toward the boundary to the diffraction grating 35. The period of the diffraction grating 34 is 202.0 nanometers at the boundary to the other diffraction grating 35. The diffraction grating 35 is 150 microns long, and the period thereof is 202.0 nanometers. The phase is continued between the diffraction gratings 33 and 34, and a phase-shift structure 38 is produced between the diffraction gratings 34 and 35. The phase-shift structure 38 shifts the phase by a quarter period of the diffraction grating 35, which is equal to an eighth of the wavelength.

Figure 10:
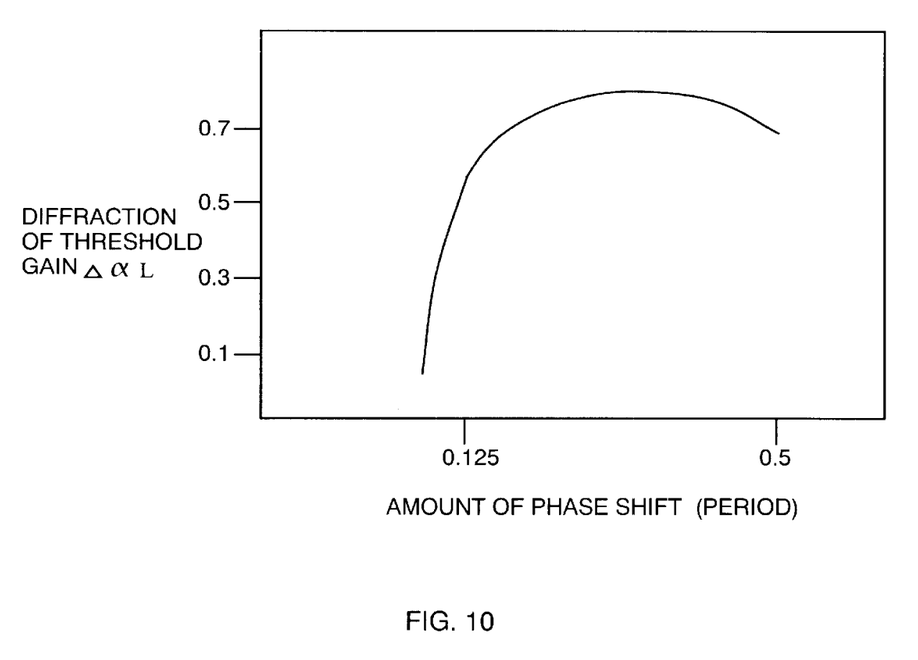
FIG. 10 is a graph showing a difference of threshold gain in terms of the amount of phase shift.

The diffraction gratings 33/34/35 and the phase-shift structure 38 give the phase-shift equivalent to a quarter wavelength to the resonator 5. This results in enhancement of the stability in the single oscillation mode. FIG. 10 illustrates the difference of threshold gain $\Delta\alpha L$ in terms of the amount of phase shift achieved by the phase-shift structure 38. As will be understood from FIG. 9, when the phase-shift structure 38 introduces the amount of phase-shift ranging from an eighth to a half of the period, the difference of threshold gain is drastically improved, and the phase-shift DFB semiconductor laser emitting device is improved in the stability in the single oscillation mode.

In this instance, the phase-shift structure 38 is formed at the boundary between the standard period region 35 and the modulated period region 34. However, the location of the phase-shift structure 38 is not limited to the boundary. A phase-shift DFB semiconductor laser emitting device according to the present invention may have the phase-shift structure 38 at the center of the resonator as similar to the prior art. Otherwise, the phase-shift structure 38 may be closer to the backward end surface than the center or to the forward end surface than the center. The modulated period region may be nonlinearly varied.

Only the diffraction gratings 33/34/35 may give the phase shift equivalent to a quarter wavelength to the resonator. This means that the phase-shift structure 38 is deleted from the phase-shift DFB semiconductor laser emitting device shown in FIG. 8.

The period is varied in the modulated period region, and this feature is indispensable to the phase-shift DFB semiconductor laser emitting device coated with the low-reflective coating layers 36/37, because the period has to be asymmetrically distributed with respect to the center of the resonator. If the modulated period region is constant in period, the resonator between the lowreflective coating layers is less asymmetrical, and, accordingly, the asymmetrical internal electric field is hardly created in the resonator. The asymmetrical distribution in the period makes the strength of the internal electric field asymmetrically distributed. This results in a large optical output power.

The standard period regions are equal to or less than two third of the total length of the diffraction gratings 33/34/35. At least a part of the standard period regions is contiguous to the forward end surface. It is necessary for the standard period regions to be at least a third of the total length. In order to enhance the stability of the single oscillation mode, the standard period regions are preferably equal to or greater than a half of the total length. However, if a higher optical output is required, it is necessary to make the standard period regions more asymmetrical with the modulated period region, and the standard period regions may be adopted to be equal to or less than a half of the total length.

It is also preferable for the phase-shift DFB semiconductor laser emitting device to linearly vary the period in the modulated period region. It is further desirable to increase the difference in period between the diffraction gratings 35 and 34 toward the backward end surface, because a distribution in phase at the backward end surface is made less influential on the optical characteristics. This results in a high production yield. The period in the modulated period region may get shorter than that of the standard period region 35/33. When the period in the modulated period region gets longer toward the backward end surface, the modulated period region effectively increases the optical output power.

The present inventor evaluated the phase-shift DFB semiconductor laser emitting device shown in FIG. 8. The present inventor determined a distribution of relative strength of electric field as indicated by plots PL3. The plots PL3 taught that the relative strength at the forward end surface was larger than that at the backward end surface. The distribution was so gentle that the internal electric field was not concentrated.

Subsequently, the present inventor measured the optical output power. The optical output power at the forward end surface was 2.5 times larger than that at the backward end surface. The present inventor calculated the difference of threshold gain $\Delta\alpha L$. The difference of threshold gain $\Delta\alpha L$ was 0.7.

Fourth Embodiment

Still another phase-shift DFB semiconductor laser emitting device embodying the present invention is similar to the third embodiment. The phase-shift DFB semiconductor laser emitting device implementing the fourth embodiment is similar to the third embodiment except the boundary between a modulated period region and a standard period region contiguous to the forward end surface. Although the phase-shift DFB semiconductor laser emitting device has three diffraction gratings, i.e. a modulated period region sandwiched between standard period regions, the period of the modulated period region is continued to the period of the standard period region contiguous to the forward end surface. The modulated period region has the period of 202.3 nanometers at the boundary to the standard period region contiguous to the backward end surface and the period of 202.3 nanometers at the boundary to the other standard period region contiguous to the forward end surface. The modulated period region is 140 nanometers long, and the phase-shift structure 38 is inserted between the modulated period region and the standard period region contiguous to the forward end surface. The phase-shift structure 38 introduces the phase-shift of an eighth of the period of the standard period region, and the phase-shift is equivalent to a sixteenth of the wavelength.

The present inventor confirmed that the distribution of relative strength was identical with that of the third embodiment. Namely, the relative strength at the forward end surface was larger than the relative strength at the backward end surface, and the distribution was gently waved.

As will be understood from the foregoing description, the asymmetric diffraction gratings produce a gently waved asymmetric internal electric field in the resonator, and increases the optical output power. Moreover, the phase-shift DFB semiconductor laser emitting device is stable in the single oscillation mode. When the phase-shift DFB semiconductor laser emitting device is used in a digital optical communication system for a signal modulation, the code error rate is decreased. The phase-shift structure and the high-reflective coating layer further make the internal electric field asymmetric. Even if the high-reflective coating layer has the reflectance close to 100 percent, an error in cleavage plane is less influential on the optical characteristics, and the production yield is improved.

The phase-shift DFB semiconductor laser emitting device is preferable for a large-capacity digital optical communication network, and allows the digital optical communication network to cope with the increase of user at low cost.

Although particular embodiments of the present invention have been shown and described, it will be apparent to those skilled in the art that various changes and modifications may be made without departing from the spirit and scope of the present invention.

In the above-described embodiments, the diffraction gratings 3/4, 23/24 and 33/34/35 are 300 microns long, another resonator incorporated in the phase-shift DFB semiconductor laser emitting device according to the present invention may have different length.

What is claimed is:

1. A distributed feedback semiconductor laser emitting device for emitting a laser light beam, comprising:
   a pair of electrodes applied with a potential difference;
   a multiple-layered semiconductor structure connected to the electrodes of said pair, and including
   a first compound semiconductor layer extending between a first end surface of said multiple-layered semiconductor structure serving as an optical output and a second end surface of said multiple-layered semiconductor structure opposite to said first end surface and
   a diffraction grating structure held in contact with said first compound semiconductor layer, extending for substantially the entire distance between said first end surface and said second end surface and having a standard period region of the diffraction grating structure constant in period and connected at one end thereof to said first end surface and a modulated period region of the diffraction grating structure different in period from said standard period region and making said diffraction grating asymmetrical with respect to a center of said diffraction grating;
   a first reflective coating layer formed on said first end surface; and
   a second reflective coating layer formed on said second end surface, and making said first compound semiconductor layer serve as a resonator, wherein said second reflective coating layer has a relatively high reflectance and said first reflective coating layer has a relatively low reflectance, wherein said first and second reflective coating layers and said diffraction grating are disposed asymmetrically with respect to a center region of said resonator with said standard period region having a length greater than half of the length of said diffraction grating between said first end surface and said second end surface.

2. The distribute feedback semiconductor laser emitting device as set forth in claim 1, in which said standard period region continuously extends from said first end surface to a certain position closer to said second end surface than said first end surface.

3. The distributed feedback semiconductor laser emitting device as set forth in claim 2, in which said modulated period region continuously extends from said certain position to said second end surface.

4. The distributed feedback semiconductor laser emitting device as set forth in claim 3, in which said modulated period region has a constant period different from the period of said standard period region.

5. The distributed feedback semiconductor laser emitting device as set forth in claim 4, in which said constant period is greater than said period of said standard period region.

6. The distributed feedback semiconductor laser emitting device as set forth in claim 4, in which said first reflective coating layer has a reflectance smaller than a reflectance of said second reflective coating layer.

7. The distributed feedback semiconductor laser emitting device as set forth in claim 3, in which said modulated period region is varied in period.

8. The distributed feedback semiconductor laser emitting device as set forth in claim 7, in which the period of said modulated period region is increased from said certain position toward said second end surface.

9. The distributed feedback semiconductor laser emitting device as set forth in claim 1, in which said standard period region has a length equal to or less than two third of the length of said diffraction grating, said modulated period region is varied in period, and said first reflective coating layer and said second reflective coating layer have a small reflectance.

10. The distributed feedback semiconductor laser emitting device as set forth in claim 9, in which said length of said standard period region is equal to or greater than a third of said length of said diffraction grating.

11. The distributed feedback semiconductor laser emitting device as set forth in claim 9, in which said length of said standard period region is equal to or greater than a half of said length of said diffraction grating.

12. The distributed feedback semiconductor laser emitting device as set forth in claim 11, in which said standard period region has a first sub-region connected to said first end surface and a second sub-region connected to said second end surface, and said modulated period region is inserted between said first sub-region and said second sub-region.

13. The distributed feedback semiconductor laser emitting device as set forth in claim 12, in which said period of said modulated period region is increased from a first boundary formed together with said first sub-region toward a second boundary formed together with said second sub-region.

14. The distributed feedback semiconductor laser emitting device as set forth in claim 13, in which said diffraction grating further has a phase-shift structure for introducing a phase shift equivalent to around a quarter wavelength to the total laser resonator.

15. The distributed feedback semiconductor laser emitting device as set forth in claim 14, in which said diffraction grating further has a phase-shift structure for introducing a phase shift ranging from an eighth to a half of the period.

16. The distributed feedback semiconductor laser emitting device as set forth in claim 15, in which said phase shift structure is provided between said first sub-region and said modulated period region.

17. The distributed feedback semiconductor laser emitting device as set forth in claim 1, in which said multiple-layered semiconductor structure further includes
   a second compound semiconductor layer held n contact with said first compound semiconductor layer on the opposite surface to the surface held in contact with said diffraction grating and providing a multiple quantum well, and
   a third compound semiconductor layer held in contact with said second compound on the opposite surface to the surface held in contact with said first compound semiconductor layer and serving as a clad layer.

18. The distributed compound semiconductor laser emitting device as set forth in claim 17, in which said multiple-layered semiconductor structure further includes a compound semiconductor layer having a major surface where said diffraction grating is formed, said first compound semiconductor layer is grown on said major surface.

19. The distributed compound semiconductor laser emitting device as set forth in claim 18, in which said standard period region has a length greater than a half of a length of said diffraction grating.

20. The distributed compound semiconductor laser emitting device as set forth in claim 18, in which the period of said modulated period region is constant.

21. The distributed compound semiconductor laser emitting device as set forth in claim 18, in which said first reflective coating layer has a reflectance smaller than a reflectance of said second reflective coating layer.

22. The distributed compound semiconductor laser emitting device as set forth in claim 18, in which said first reflective coating layer and said second reflective coating layer has a small reflectance, and the period of said modulated period region is varied.

23. The distributed compound semiconductor laser emitting device as set forth in claim 22, in which said diffraction grating further has a phase-shift structure for introducing a phase shift ranging from an eighth to a half of the period.

* * * * *